(12) United States Patent
Liu et al.

(10) Patent No.: US 11,573,188 B2
(45) Date of Patent: Feb. 7, 2023

(54) IMAGE PROCESSING METHOD AND DEVICE FOR CDSEM

(71) Applicant: SHANGHAI HUALI INTEGRATED CIRCUIT CORPORATION, Shanghai (CN)

(72) Inventors: Jiaqi Liu, Shanghai (CN); Lin Li, Shanghai (CN); Shirui Yu, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 169 days.

(21) Appl. No.: 17/197,756

(22) Filed: Mar. 10, 2021

(65) Prior Publication Data
US 2021/0325314 A1   Oct. 21, 2021

(30) Foreign Application Priority Data
Apr. 15, 2020 (CN) .......................... 202010295827.5

(51) Int. Cl.
*G01N 21/88*   (2006.01)
*G01N 21/31*   (2006.01)
*G01N 21/95*   (2006.01)

(52) U.S. Cl.
CPC ..... *G01N 21/8851* (2013.01); *G01N 21/3151* (2013.01); *G01N 21/9501* (2013.01);
(Continued)

(58) Field of Classification Search
CPC .............. G02B 6/02352; G02B 6/0238; G02B 6/02323; G02B 6/02347; G02B 21/06; G02B 21/0032; G02B 21/0056; G02B 21/0076; G02B 26/06; G02B 27/58; G02B 1/11; G02B 21/10; G02B 21/12; G02B 21/125; G02B 21/14; G02B 27/0093; G02B 27/0172; G02B 5/30; G02B 2027/014;
(Continued)

(56) References Cited

U.S. PATENT DOCUMENTS

| | | | | |
|---|---|---|---|---|
| 6,314,212 B1 * | 11/2001 | Womack | ............... | G01B 11/02 |
| | | | | 250/559.19 |
| 6,853,736 B2 * | 2/2005 | Miyake | ................. | G06T 1/005 |
| | | | | 713/176 |
| 2015/0276378 A1 * | 10/2015 | Shcherbakov | ......... | G01N 21/93 |
| | | | | 356/625 |

FOREIGN PATENT DOCUMENTS

| | | | | | |
|---|---|---|---|---|---|
| CN | 101753797 A | * | 6/2010 | ............ | G06T 5/002 |
| CN | 108062500 A | * | 5/2018 | ......... | G06K 9/00127 |

(Continued)

*Primary Examiner* — Michael P Stafira
(74) *Attorney, Agent, or Firm* — Alston & Bird LLP

(57) ABSTRACT

The present invention provides an image processing method for CDSEM for determining a measuring range of an image of a target pattern measured by a CDSEM machine. The image processing method of CDSEM comprises: obtaining a first gray scale image based on the image of the target pattern; performing Fourier transform to the first gray scale image to obtain a first frequency spectrum distribution; filtering out frequency spectrum components whose absolute values of ordinate are greater than preset threshold in the first frequency spectrum distribution to obtain a second frequency spectrum distribution, the preset threshold relates to the background noise and the signal frequency of SRAF features; and determining the measuring range based on the second frequency spectrum distribution.

20 Claims, 6 Drawing Sheets

(52) U.S. Cl.
CPC ................ *G01N 2021/3185* (2013.01); *G01N 2021/888* (2013.01); *G01N 2021/8887* (2013.01)

(58) Field of Classification Search
CPC .... G02B 2027/0147; G02B 2027/0185; G02B 27/0012; G02B 27/0179; G02B 6/02371; G01N 2291/02483; G01N 2291/106; G01N 23/046; G01N 29/0654; G01N 29/07; G01N 29/46; G01N 2223/206; G01N 2223/419; G01N 2291/017; G01N 2291/02466; G01N 2291/02836; G01N 2291/101; G01N 23/04; G01N 29/02; G01N 29/032; G01N 29/036; G01N 29/0609; G01N 21/41; G01N 21/95607; G01N 25/72; G01N 1/08; G01N 15/14; G01N 2015/0065; G01N 2015/1006; G01N 2015/1075; G01N 2015/1447; G01N 2015/1452; G01N 2015/1486; G01N 2015/149; G01N 2021/3185; G01N 2021/888; G01N 2021/8887; G01N 21/3151; G01N 21/8851; G01N 21/9501; G01N 2203/0073; G01N 2223/614; G01N 23/2251; G01N 2333/195; G01N 27/83; G01N 3/00; G01N 33/42; G01N 33/493
See application file for complete search history.

(56) References Cited

FOREIGN PATENT DOCUMENTS

| | | | | |
|---|---|---|---|---|
| CN | 105740796 B | * | 11/2018 | ......... G06K 9/00791 |
| CN | 110889906 A | * | 3/2020 | ........... G06Q 20/145 |
| DE | 10027132 A1 | * | 2/2001 | ............. G01N 21/33 |
| DE | 102005017642 A1 | * | 10/2006 | ....... G01N 21/95607 |
| WO | WO-2009115329 A1 | * | 9/2009 | ................ G03F 1/84 |
| WO | WO-2018108912 A1 | * | 6/2018 | ........... G06T 7/0004 |
| WO | WO-2018108914 A1 | * | 6/2018 | ......... G01N 23/2251 |

\* cited by examiner

IMAGE PROCESSING METHOD AND DEVICE FOR CDSEM

CROSS-REFERENCES TO RELATED APPLICATIONS

This application claims priority to Chinese patent application No. CN202010295827.5, filed on Apr. 15, 2020 at CNIPA, and entitled "AN IMAGE PROCESSING METHOD AND DEVICE FOR CDSEM", the disclosure of which is incorporated herein by reference in entirety.

TECHNICAL FIELD

The present invention relates to the field of semiconductor manufacture process, in particular, relates to an image processing method and device.

BACKGROUND

The critical dimensions (CD) of large scale integrated circuit chips are getting smaller with the development of IC manufacturing technologies. To monitor the accuracy of pattern dimensions post exposure and development of lithographic steps, CDSEM tools are used to measure the critical dimensions of the photo resist patterns on the wafer, to check if CDs meet the specification requirements.

Measuring the patterns which have been exposed, especially measuring the one-dimensional pattern, is an important task in IC manufacturing. For example, at the early stage of process development, measuring the pattern data of Focus-Energy Matrix on the wafer under exposure conditions not only checks the lithography process window, but also determines the best exposure conditions including the optimal focus and the optimal dose, that enables IC manufacture process.

Generally, the optimal exposure dose is often decided based on linear measurement of critical patterns, and common critical patterns include the width of dense lines or the spacing of dense spaces. Therefore, the accuracy and success rate of dense line/space pattern measurement are critical.

When measuring the patterns using a scanning electron microscope dedicated for critical dimension measurement (CDSEM) machine, the CDSEM machine images patterns to be measured first, then selects and marks the measuring range, and finally performs measuring in the selected range. As shown in FIG. 1, the solid line box is the measuring range selected, the solid line inside the measuring range is the central line, and the dashed line box in the measuring range is the position of line edge.

The result of measuring is affected by the marker's selecting range. There are two setting methods of a marker, one method is to place the marker manually in a certain position, and the other is to place the marker according to the pattern of the design layout. In actual measurement, the positions of the marker might deviate from the range of the pattern to be measured. Generally, there are two reasons for these deviations: 1. The interference caused by the exposure and development of Sub-Resolution Assistant Feature (SRAF) that has been widely used in advanced patterning improvements; 2. The background noise of imaging is strong. These two reasons both affect the success rate of CDSEM measurements, resulting in inaccuracy or less efficiency.

To solve the aforementioned problem, the present invention provides an image processing method which can automatically determine measuring ranges and mitigate the interference from the exposure and development of SRAF and the background noise from the patterns to be measured.

BRIEF SUMMARY OF THE DISCLOSURE

A brief overview of one or more aspects is provided below. The summary is not an extensive overview of all of the aspects that are contemplated, and is not intended to identify key or decisive elements in all aspects. The sole purpose of the summary is to present some concepts of one or more aspects in a simplified form as a prelude to the more detailed description that is presented later.

The embodiment of the disclosure provides an image processing method for a CDSEM, comprising: providing a sample having a pattern to be measured; acquiring a first gray scale image of the pattern on the CDSEM; performing Fourier transform to the first gray scale image to obtain a first frequency spectrum distribution comprising first frequency spectrum components; filtering the first frequency spectrum distribution and excluding those having absolute values of ordinate greater than a preset threshold from the first frequency spectrum components, to obtain a second frequency spectrum distribution comprising second frequency spectrum components; and determining a measuring range of the pattern on the CDSEM based on the second frequency spectrum distribution.

In some examples, the preset threshold is a low frequency threshold, wherein the filtering the first frequency spectrum distribution and excluding those having absolute values of ordinate greater than a preset threshold from the first frequency spectrum components, excluding those having absolute values of ordinate greater than a preset threshold from the first frequency spectrum components to obtain the second frequency spectrum distribution comprises: filtering the frequency spectrum components whose absolute values of ordinate are greater than the preset low frequency spectrum threshold in the first frequency spectrum distribution to obtain the second frequency spectrum distribution.

In some examples, the second frequency spectrum distribution comprises second frequency spectrum components having low frequency spectrum components and high frequency spectrum components, wherein the determining the measuring range of the pattern on the CDSEM based on the second frequency spectrum distribution comprises: identifying a central location of the measuring range based on the low frequency spectrum components in the second frequency spectrum distribution; identifying two edges of the pattern for further locating the measuring range based on the central location and the high frequency spectrum components of the second frequency spectrum distribution; and deciding on the measuring range based on the central location and the two edges of the pattern.

In some examples, the identifying the central location of the measuring range based on the low frequency spectrum components in the second frequency spectrum distribution comprises: extracting the low frequency spectrum components of the second frequency spectrum distribution to obtain a third frequency spectrum distribution; performing an inverse Fourier transform to the third frequency spectrum distribution to obtain a third gray scale image; and identifying the central location of the measuring range based on a brightness distribution of the third gray scale image.

In some examples, the extracting the low frequency spectrum components of the second frequency spectrum distribution to obtain the third frequency spectrum distribution comprises: extracting the second frequency spectrum components each having a sum of an absolute abscissa value and an absolute ordinate value being less than a preset low frequency spectrum threshold in the second frequency spectrum distribution, and wherein the extracted second frequency spectrum components form the third frequency spectrum distribution.

In some examples, the identifying the central location of the measuring range based on the brightness distribution of the third gray scale image comprises: identifying abscissas (X-axis coordinates) in the third gray scale image where brightness are a lowest; and defining the central location of the measuring range at an abscissa which has a lowest brightness and is closest to a central location of the pattern.

In some examples, the identifying the two edges of the measuring range based on the central location and the high frequency spectrum components of the second frequency spectrum distribution comprises: extracting the high frequency spectrum components of the second frequency spectrum distribution to obtain a fourth frequency spectrum distribution; performing the inverse Fourier transform to the fourth frequency spectrum distribution to obtain a fourth gray scale image; deducting background noises of the fourth gray scale image; and identifying the two edges based on the central location and a brightness distribution of the fourth gray scale image after the background noises are subtracted.

In some examples, each of the high frequency spectrum components has a sum of an absolute value of abscissa and an absolute value of ordinate, and wherein the sum is greater than a preset high frequency spectrum threshold in the third frequency spectrum distribution.

In some examples, subtracting the background noises of the fourth gray scale image comprises: calculating an average brightness of the fourth gray scale image; and subtracting the average brightness from a brightness at each location in the fourth gray scale image to deduct the background noises.

In some examples, the identifying the two edges based on the central location and the brightness distribution of the fourth gray scale image whose background noises are deducted comprises: identifying the abscissas of locations which have a highest brightness in the fourth gray scale image after deducting the background noises; identifying two locations at two abscissas each having a highest brightness and being closest to the central location in the fourth gray scale image as being a left edge and a right edge of the central location respectively; identifying a position of the left edge in the fourth gray scale image as being a central location of a left measuring range; and identifying a position of the right edge in the fourth gray scale image as being a central location of a right measuring range.

In some examples, the method further comprising: determining if it is necessary to redefine the measuring range of the pattern; if it is necessary, filtering the first frequency spectrum distribution and excluding those having absolute values of ordinate greater than a preset threshold from the first frequency spectrum components to obtain the second frequency spectrum distribution; and determining the measuring range based on the second frequency spectrum distribution.

In some examples, further comprising: extracting one-dimensional frequency characteristics of an abscissa axis when an ordinate equals to zero in the first frequency spectrum distribution; and determining if it is necessary to redefine the measuring range of the pattern based on the extracted one-dimensional frequency characteristics.

In some examples, the method further comprises: if the one-dimensional frequency characteristics include a multi-peak symmetric structure, it is not necessary to redetermine the measuring range; or if the one-dimensional frequency characteristics does not include a multi-peak symmetric structure, it is necessary to redetermine the measuring range.

Another embodiment of the disclosure comprises: a memory cell; and a processor coupled to the memory cell, wherein the processor is configured to: obtain a first gray scale image based on an image of a target pattern to be measured; perform Fourier transform to the first gray scale image to obtain a first frequency spectrum distribution comprising first frequency spectrum components; filter the first frequency spectrum distribution and exclude those having absolute values of ordinate greater than a preset threshold from the first frequency spectrum components, to obtain a second frequency spectrum distribution comprising second frequency spectrum components; and determine a measuring range of the pattern on the CDSEM based on the second frequency spectrum distribution.

In some examples, the preset threshold is a low frequency spectrum threshold, wherein the processor is further configured to: filter the frequency spectrum components whose absolute values of ordinate are greater than the preset low frequency spectrum threshold in the first frequency spectrum distribution to obtain the second frequency spectrum distribution.

In some examples, the processor is further configured to: identify a central location of the measuring range based on low frequency spectrum components in the second frequency spectrum distribution; identify two edges of the measuring range based on the central location and high frequency spectrum components of the second frequency spectrum distribution; and determine the measuring range based on the central location and the two edges.

In some examples, the processor is further configured to: extract the low frequency spectrum components of the second frequency spectrum distribution to obtain a third frequency spectrum distribution; perform an inverse Fourier transform to the third frequency spectrum distribution to obtain a third gray scale image; and determine the central location of the measuring range based on a brightness distribution of the third gray scale image.

In some examples, the processor is further configured to: extracting frequency spectrum components each having a sum of an absolute abscissa value and an absolute ordinate value being less than a preset low frequency spectrum threshold in the second frequency spectrum distribution, and wherein the extracted second frequency spectrum components form the third frequency spectrum distribution.

In some examples, the processor is further configured to: determine the abscissas of positions whose brightness are lowest in the third gray scale image; and determine an abscissa whose brightness is lowest and which is closest to a central location of abscissa of the pattern to be measured as being the central location of the measuring range.

In some examples, the processor is further configured to: extract the high frequency spectrum components of the second frequency spectrum distribution to obtain a fourth frequency spectrum distribution; perform an inverse Fourier transform to the fourth frequency spectrum distribution to obtain a fourth gray scale image; deduct background noises of the fourth gray scale image; and determine the two edges based on the central location, and a brightness distribution of the fourth gray scale image whose background noises are deducted.

In some examples, the processor is further configured to: extract the frequency spectrum components whose sum of absolute values of abscissa and ordinate are greater than a preset high frequency spectrum threshold in the third frequency spectrum distribution to be the fourth frequency spectrum distribution.

In some examples, the processor is further configured to: determine an average brightness of the fourth gray scale image; and subtract the average brightness from the brightness value of each coordinate in the fourth gray scale image to deduct the background noises.

In some examples, the processor is further configured to: determine the abscissas of positions whose brightness are highest in the fourth gray scale image whose background noises are deducted; determine the two abscissas whose brightness are highest and which are closest to the central location as being a left edge and a right edge of the central location respectively; determine a position of the left edge as being a central location of a left measuring range; and determine a position of the right edge as being a central location of a right measuring range.

In some examples, the processor is further configured to: determine whether redetermining the measuring range of the pattern to be measured is needed or not; in response to determining that redetermining the measuring range of the pattern to be measured is needed, filter the frequency spectrum components whose absolute values of ordinate are greater than preset threshold in the first frequency spectrum distribution to obtain the second frequency spectrum distribution; and determine the measuring range based on the second frequency spectrum distribution.

In some examples, the processor is further configured to: extract one-dimensional frequency characteristics of the abscissa axis where the ordinate equals to zero in the first frequency spectrum distribution; and determine whether redetermining the measuring range is needed or not based on the extracted one-dimensional frequency characteristics.

In some examples, the processor is further configured to: in response to the one-dimensional frequency characteristics having a multi-peak symmetric structure, determine not to redetermine the measuring range, otherwise, redetermine the measuring range.

Another embodiment of the disclosure provides a computer storage medium having computer programs stored thereon, wherein the computer programs implement steps of the image processing method of CDSEM when the computer programs are executed.

BRIEF DESCRIPTION OF THE DRAWINGS

The above features and advantages of the present invention will be better understood after reading the detailed description of the embodiments of the present disclosure in conjunction with the following figures.

DETAILED DESCRIPTION OF THE DISCLOSURE

Figure 1:
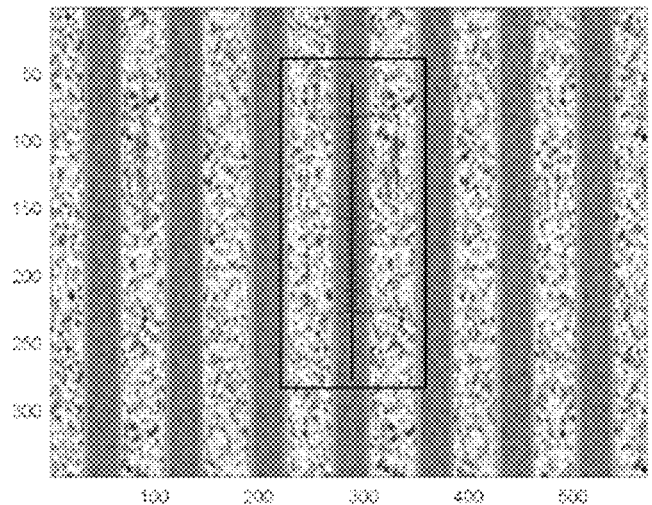
FIG. 1 shows concepts of measuring range in a CDSEM image in the related art.

The following description is presented to enable one of ordinary skill in the art to implement and use the present invention and incorporate it into the context of a particular application. Various modifications, as well as various usages in various applications, will be readily apparent to those skilled in the art, and the generic principles defined herein may be applicable to a wide range of embodiments. Thus, the present invention is not limited to the embodiments presented herein, but rather should be given its broadest scope consistent with the principles and novel features disclosed herein.

In the following detailed description, numerous specific details are set forth to provide a more thorough understanding of the present invention. However, it will be apparent to those skilled in the art that the present invention may be practiced without limitations from these specific details. In other words, well-known structures and devices are shown in a block diagram form and are not shown in detail, so as to avoid obscuring the present invention.

The reader is cautioned as to all files and documents which are filed at the same time as this specification and which are open for the public to consult, and the contents of all such files and documents are incorporated herein by reference. Unless directly stated otherwise, all features disclosed in this specification (including any of the appended claims, the abstract, and the accompanying drawings) may be replaced by alternative features serving the same, equivalent, or similar purposes. Therefore, unless expressly stated otherwise, each of the features disclosed is only one example of a group of equivalent or similar features.

Moreover, any component that does not expressly indicate a device for performing a specific function or a step for performing a specific function in the claims should not be construed as a device or step clause as specified in 35 USC Chapter 112, paragraph 6. In particular, the use of "steps of . . ." or "actions of . . ." in the claims herein does not mean that the provisions of paragraph 6 of 35 USC § 112 are involved.

Note that when used, the flags left, right, front, back, top, bottom, front, back, clockwise, and counter clockwise are used for convenience purposes only and do not imply any specific fixed direction. In fact, they are used to reflect the relative position and/or direction between various parts of an object. In addition, the terms "first" and "second" are only used for descriptive purposes, and cannot be understood as indicating or implying relative importance.

In the description of the present invention, it should be noted that the terms "installation", "connecting", and "connected" should be understood broadly unless explicitly stated and defined otherwise. For example, the terms "installation", "connecting", and "connected" may be either a fixed connection, a detachable connection, or an integral connection; the terms may be either a mechanical connection or an electrical connection; the terms also may be either a direct connection, an indirect connection through an intermediate medium, or an internal connection between two components. The specific meaning of the above terms in the present invention can be understood in a specific case by those skilled in the art.

Note that in the case of use, further, better, further and more preferably is a simple beginning of another embodiment on the basis of the foregoing embodiment, which is further, better, and further The combination of the content of the ground or the better ground and the foregoing embodiment constitutes a complete composition of another embodiment. After the same embodiment, a number of further, better, further or even better arrangements can be combined to form yet another embodiment.

The present invention will be described in detail below in conjunction with the drawings and specific embodiments. Note that the following aspects described in conjunction with the drawings and specific embodiments are only exemplary, and should not be construed as limiting the protection scope of the present invention.

According to an aspect of the present invention, it provides an image processing method of CDSEM, which is used to determine a measuring range of an image of patterns to be measured by CDSEM machine.

Figure 2:
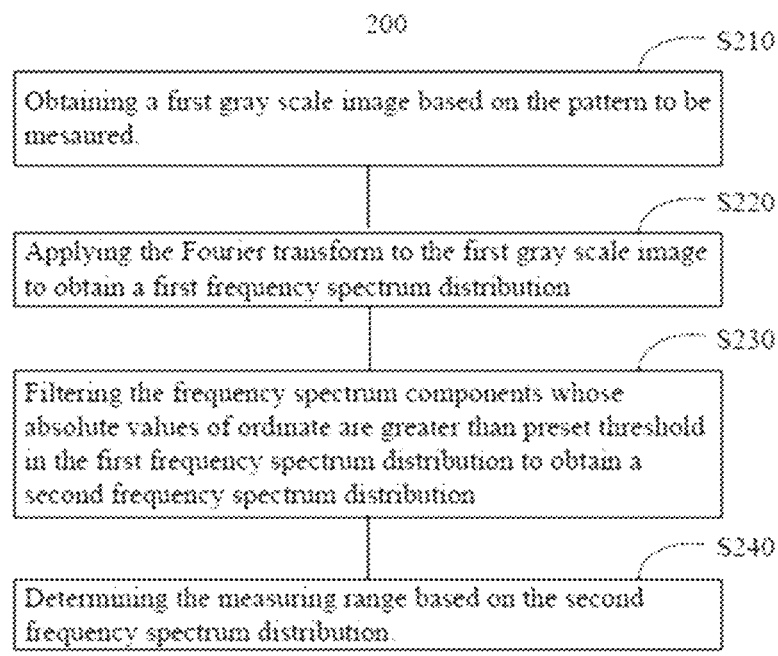
FIG. 2 shows some steps of a flow chart of an image processing method of CDSEM in according to some embodiments of the present invention.

In one embodiment, as shown in FIG. 2, the image processing method 200 of CDSEM comprises steps S210-S240.

Step S210 comprises: obtaining a first gray scale image based on the image of the pattern to be measured.

Gray scale image is also called gray level image. Specifically, the signal range between white and black images is divided into a number of levels according to logarithmic relationship, also known as the gray scale. Gray scale can be divided into 256 levels. An image represented in gray scale is a gray scale image.

Using floating-point algorithm, integer method, shift method, average method, green-only method or other existing or future methods may transform the image of the pattern to be measured into the first gray scale image.

Step S220 comprises: applying the Fourier transform to the first gray scale image to obtain a corresponding first frequency spectrum distribution.

The special frequency of an image is the index characterizing the intensity of gray scale change, and is the gradient of the gray scale in the plane space. For example, a large area of a desert is an area with slow gray scale changes in the image, and the corresponding special frequencies are very low; while for the edge area where the surface attributes change drastically, it is an area with drastic gray scale changes in the image, corresponding to higher frequencies.

Fourier transform can transform the function meeting certain conditions into a sine function, a cosine function or a linear combination thereof. Applying the Fourier transform to an image is to transform the gray scale distribution function of the pattern into a frequency distribution function, and applying the inverse Fourier transform to an image is to transform the frequency distribution function of the pattern into a gray scale distribution function.

Fourier transform is applied to the gray scale image to obtain the frequency spectrum distribution, which is the distribution image of the image gradient. The bright and dark points on the Fourier frequency spectrum distribution, that is, the gradient of the point and the frequency of the point, can be understood in such a way that: the low frequency part of the image has a low gradient and the high frequency part has a high gradient. Generally, if the gradient is large, the brightness of the point is strong; otherwise the brightness of the point is weak. Therefore, by analyzing the frequency spectrum distribution which is obtained after the Fourier transform, it is easy to know the energy distribution of the image. If there are more dark points in the frequency spectrum distribution, the actual image is softer, because the points are not much different from their neighbors and the gradient is relatively small. Conversely, if there are many bright points in the frequency spectrum distribution, the actual image must be sharp, with clear boundaries and large differences in pixels on both sides of the boundary.

Background noise and exposure and development of SRAF will cause dramatic changes of brightness and darkness in the gray scale image, which correspond to the increase of gradient in the frequency spectrum distribution. Therefore, analyzing the gradient of the first frequency spectrum distribution image obtained by applying the Fourier transform to the gray scale image of pattern to be measured, the interference from the background noise and the exposure and development of SRAF can be determined. Based on the frequency distribution of the interference caused by the background noise and the exposure and development of SRAF, the interference caused by the background noise and the exposure and development of SRAF can be filtered.

Step S230 comprises: filtering out the frequency spectrum components whose absolute values of ordinate are greater than preset threshold in the first frequency spectrum distribution to obtain a second frequency spectrum distribution, wherein the preset threshold relates to the frequency spectrum characteristic of interference caused by the background noise and the exposure and development of SRAF.

Generally, the background noise and the exposure and development of SRAF will cause high frequency components in the first frequency spectrum distribution; therefore, filtering out the high frequency components in the first frequency spectrum distribution can reduce or eliminate the interference from background noise and the exposure and development of SRAF. The preset threshold is a preset low frequency spectrum threshold, which may be set based on the different requirement of image processing accuracy.

In one preferable embodiment, step S230 may comprise: filtering the frequency spectrum components whose absolute values of ordinate are greater than preset low frequency spectrum threshold in the first frequency spectrum distribution to obtain the second frequency spectrum distribution. Preferably, the preset low frequency spectrum threshold is set to zero.

Figure 3:
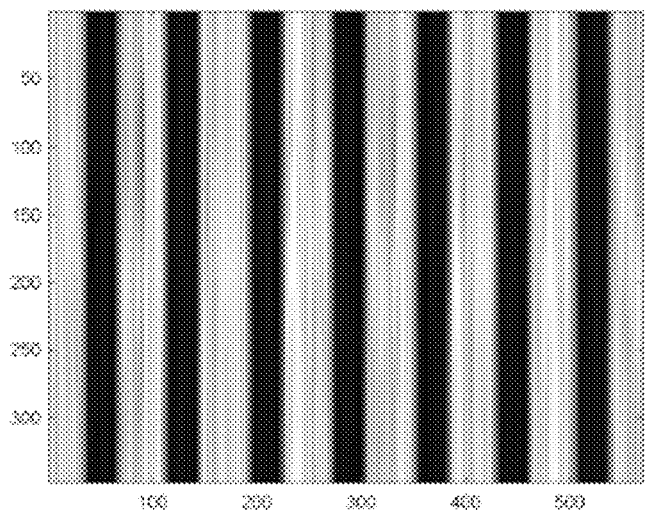
FIG. 3 shows the second gray scale image in an embodiment of the present invention.

To visually show the changes in the pattern to be measured after eliminating the interference from the background noise and the exposure and development of SRAF, take the first gray scale image shown in FIG. 1 as an example, by filtering the frequency spectrum components whose absolute values of ordinate are greater than 1 in the first frequency spectrum distribution to obtain the second frequency spectrum distribution, then applying the inverse Fourier transform to the second frequency spectrum distribution to obtain the corresponding second gray scale image, as shown in FIG. 3, showing that the interference from background noises in the second gray scale image has been effectively suppressed comparing to the first gray scale image, and the interference from the exposure and development of SRAF is also suppressed.

Step S240 may comprise: determining the measuring range based on the second frequency spectrum distribution.

Figure 4:
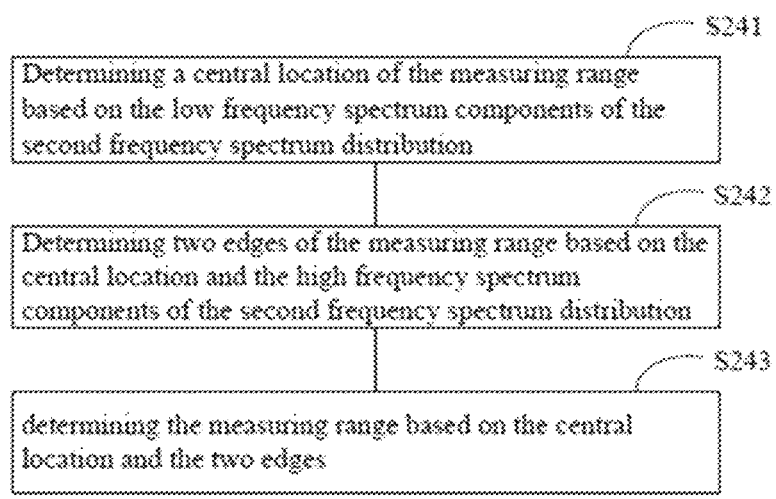
FIG. 4 shows more steps of the flow chart of the CDSEM image processing method according to an embodiment of the present invention.

Preferably, in order to automatically determine the measuring range of the pattern to be measured, it can be determined correspondingly based on the characteristics of frequency spectrum of the central location and the edge areas of the measuring range. Furthermore, as shown in FIG. 4, step S240 can further include steps S241-S243.

Step S241 may comprise: determining the central location of measuring range based on the low frequency spectrum components of the second frequency spectrum distribution.

The central location is generally set in the middle of the pattern to be measured, which is the location with the least changing brightness in gray scale image, and can be determined based on the low frequency spectrum components of the second frequency spectrum distribution.

Figure 5:
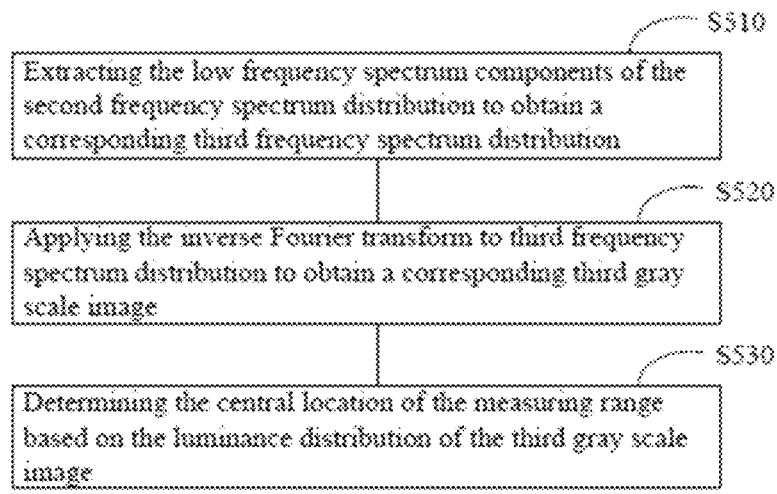
FIG. 5 shows more steps of the flow chart of the CDSEM image processing method according to an embodiment of the present invention.

Furthermore, as shown in FIG. 5, step S241 may comprise steps S510-S530.

Step S510 may comprise: extracting the low frequency spectrum components of the second frequency spectrum distribution to obtain the corresponding third frequency spectrum distribution.

The low frequency spectrum components can reflect the frequency spectrum components with slow gray scale changes, and gray scales are generally more uniform at the central location of the measuring range, that is, the gray scale changes slowly. Therefore, the central location of the measuring range can be determined based on the low frequency spectrum components.

Preferably, the high frequency spectrum components in both the X direction and the Y direction may be filtered out. For example, the frequency spectrum components whose sum of the absolute values of abscissa (X-axis) and ordinate (Y-axis) are less than preset threshold in the second frequency spectrum distribution may be extracted to be the low frequency spectrum components. The preset threshold is a preset low frequency spectrum threshold set based on the requirement of image processing accuracy. The extracted frequency spectrum components constitute the third frequency spectrum distribution. Preferably, the preset low frequency spectrum threshold can be set to 5.

Step S520 may comprise: applying the inverse Fourier transform to the third frequency spectrum distribution to obtain the corresponding third gray scale image.

Figure 6:
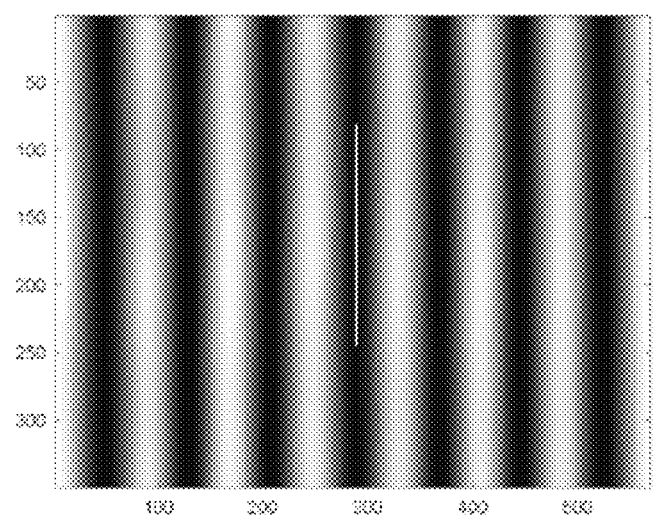
FIG. 6 shows the third gray scale image according to the embodiment of the present invention.

Take the second gray scale image shown in FIG. 3 as an example. The frequency spectrum components whose sum of absolute value of abscissa and ordinate are equal to 1 (less than 5) in the second frequency spectrum distribution corresponding to the second gray scale image may be extracted to be the third frequency spectrum distribution, and the inverse Fourier transform may be performed to the third frequency spectrum distribution to obtain the third gray scale image as shown in FIG. 6. Obviously, the gray scale change of FIG. 6 is slower than that of FIG. 3, and the interference from the background noise and the exposure of SRAF is further reduced, almost invisible. The intensity of the brightness in the third gray scale changes gradually, and there is almost no sudden change. Therefore, the central location may be determined based on the brightness distribution of the third gray scale image.

Step S530 may comprise: determining the central location based on the brightness distribution of the third gray scale image.

In third gray scale image, a one-dimensional gray scale image whose ordinates equal to a constant is selected. The abscissas of the positions whose brightness are lowest in the third gray scale image may be determined based on the brightness of the positions where ordinates equal to a constant, and the abscissa of the central location exists among these determined abscissas. Preferably, selecting an abscissa which is closest to the central location of abscissa of the pattern to be measured from the abscissas with the lowest brightness to be the central location of measuring range. For example, the abscissa range of a pattern to be measured is [0,600], assuming the abscissas with the lowest brightness are {50,130,210,290,370,450,530}, and the abscissa of the central location of abscissa is 300, and the abscissa 290 whose brightness is lowest and which is closest to the central location of abscissa is selected as the central location of measuring range.

Generally, the ordinate at the central location of ordinate of the pattern to be measured can be selected as the constant for obtaining the one-dimensional gray scale image. For example, the ordinate range of the pattern to be measured is [0,300], then the one-dimensional gray scale image with an ordinate of 150 can be selected to determine the abscissa of the central location.

Furthermore, step S242 may comprise: determining two edges of the measuring range based on the central location, and high frequency spectrum components of the second frequency spectrum distribution.

The edges are the positions where the gray scale changes sharply, therefore, the edges can be determined by the high frequency spectrum components of the second frequency spectrum distribution. The measuring range should cover the two edges near the central location, so the edges of the measuring range may be determined in connection with the central location determined in step S241.

Figure 7:
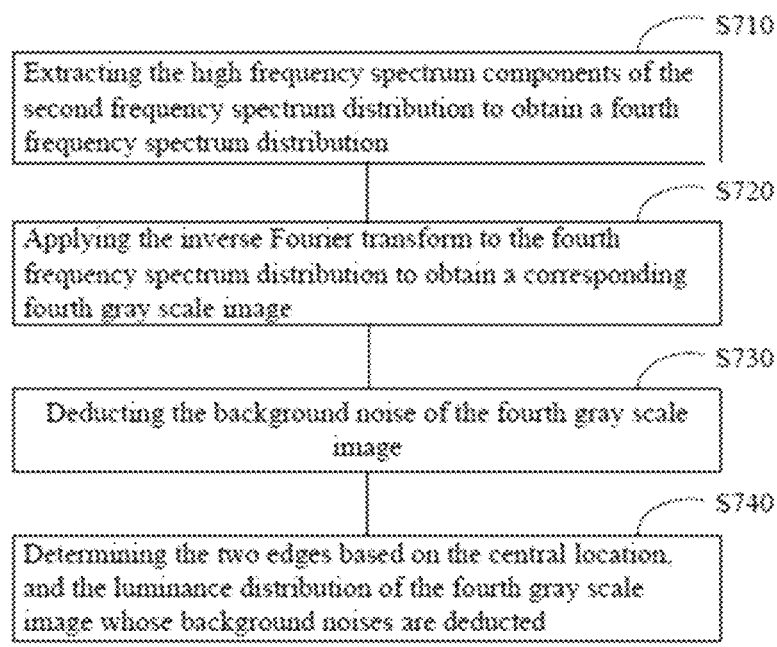
FIG. 7 shows additional steps of the flow chart of the CDSEM image processing method according to some embodiments of the present invention.

Preferably, as shown in FIG. 7, step S424 can be divided into steps S710-S740.

Step S710 may comprise: extracting the high frequency spectrum components of the second frequency spectrum distribution to obtain the fourth frequency spectrum distribution.

The high frequency spectrum components can reflect the frequency spectrum components with highest gray scale changes, and the edges of the measuring range are the positions with highest changes of gray scale. Therefore, the high frequency spectrum components of the second frequency spectrum distribution may be extracted to determine the two edges.

Preferably, the high frequency spectrum components in both the X direction and the Y direction may be extracted. For example, the frequency spectrum components whose sum of absolute value of abscissa and ordinate are higher than preset threshold in the second frequency spectrum distribution may be extracted to be the high frequency spectrum components. The preset threshold is a preset high frequency spectrum threshold set based on the requirement of image processing accuracy. The extracted frequency spectrum components constitute the fourth frequency spectrum distribution. Preferably, the preset high frequency spectrum threshold can be set to 50 or 60.

Step S720 may comprise: applying the inverse Fourier transform to the fourth frequency spectrum distribution to obtain the corresponding fourth gray scale image.

Step S730: deducting the background noise of the fourth gray scale image.

Figure 8:
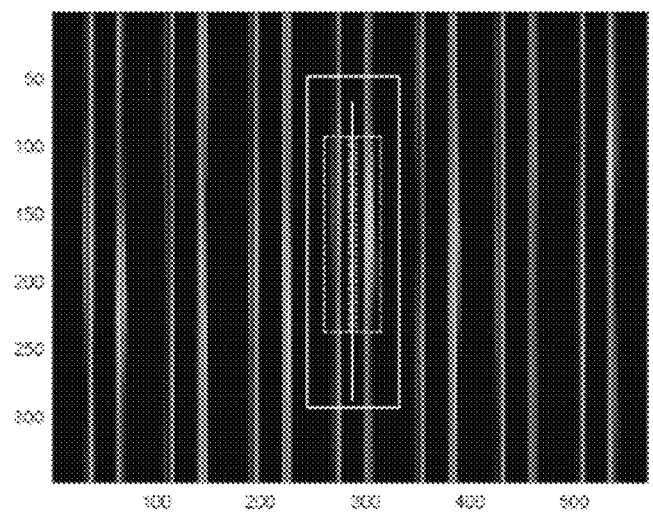
FIG. 8 shows the fourth gray scale image according to the embodiment of the present invention.

Take the second gray scale image shown in FIG. 3 as an example. the high frequency spectrum components whose sum of absolute value of abscissa and ordinate are equal to 60 (higher than 50) in the second frequency spectrum distribution corresponding to the second gray scale image may be extracted to be the fourth frequency spectrum distribution, and the inverse Fourier transform may be performed to fourth frequency spectrum distribution to obtain the corresponding fourth gray scale image. The background noise in the fourth gray scale image is deducted to obtain the fourth gray scale image without the background noise corresponding to the second gray scale image shown in FIG. 3. As shown in FIG. 8, it is obvious that the fourth gray scale image without the background noise highlights the positions with highest gray scale changes, and the positions with highest gray scale changes correspond to the positions with the highest brightness. Then, the two edges can be determined based on the brightness distribution of the fourth gray scale image without the background noise.

Specifically, the average brightness of the fourth gray scale image can be determined based on the brightness of all the positions in the fourth gray scale image, and then the average brightness is subtracted from the brightness of all the positions in the fourth gray scale image to achieve background noise deduction. Subtracting the average brightness can uniformly adjust the brightness of the positions whose brightness value is less than or equal to the average brightness in the fourth gray scale image to 0, so it can further highlights the positions whose brightness value is greater than the average brightness in the fourth gray scale image, that is beneficial for determining the position with the largest brightness value, that is, the position with highest gray scale change, and then the positions of edges may be determined.

Step S740 may comprises: determining the two edges based on the central location, and the brightness distribution of the fourth gray scale image whose background noises are deducted.

A one-dimensional gray scale image whose ordinate equal to a constant may be selected from the fourth gray scale image whose background noise are deducted. The abscissas of the positions whose brightness are highest may be determined based on the brightness of the positions whose ordinates equal to the constant. The abscissa of the central location exists among these abscissas. Preferably, two abscissas which are closest to the central location of the pattern to be measured as determined in step S241 may be selected from the abscissas with the highest brightness to be the two edges. For example, assuming the abscissas with the highest brightness are {40,73,113,140,190,226,276,303, 353,380,430,457,507,55}, the abscissa of the central location is 290, and two abscissas of 276 and 303 whose brightness are highest and which are closest to the central location of 290 are selected to be the two edges.

The theoretical position of the measuring target is the two edges, but the actual position of the measuring target may deviate from its theoretical position. Therefore, the left measuring range and the right measuring range can be determined respectively based on the two edges, as the searching range of the measuring target.

Furthermore, the left measuring range takes the abscissa which locates on the left of and is closest to the central location as its center. In the above assumption, taking the left abscissa of 276 closest to the center position of 290 and with the highest brightness as an example, the left measuring range as determined based on the abscissa of 276 is symmetrical to X=276 but does not cover the center position X=290. The right measuring range takes the abscissa which locates on the right of and is closest to the central location as its center, which is similar to the left measuring range, and will not be discussed in examples.

The left measuring range is located between the central location and the abscissa (the abscissa of 226 in the above embodiment) with highest brightness that is the second closest to and on the left of the central location. The right measuring range is located between the central location and the abscissa (the abscissa of 353 in the above embodiment) with highest brightness that is the second closest to and on the right of the central location.

Step S243 may comprise: determining the measuring range based on the central location and the two edges.

After determining the central location and the two edges, the measuring range can be determined by taking the central location as its center, and the measuring range can be slightly beyond the left border of the left measuring range and the right border of the right measuring range. The marked measuring range is located between the abscissa (the abscissa of 226 in the above embodiment) with highest brightness that is the second closest to and on the left of the central location and the abscissa (the abscissa of 353 in the above embodiment) with highest brightness that is the second closest to and on the right of the central location, as shown in FIG. 8.

Furthermore, after determining the measuring range, the measurement can be performed at the corresponding position in patterns to be measured taken by the CDSEM machine without any processing.

The determination of the measuring range can be performed when the position of the marker determined in the prior art deviates from the range of the pattern to be measured. In order to determine whether the marker determined by the prior art deviates from the range of the pattern to be measured, that is, to determine whether the image processing method 200 described above needs to be employed to redetermine the measuring range, the CDSEM image processing method 200 may further include the step of redetermining the measuring range. After it is determined that the measuring range needs to be redetermined, the steps S210-S240 are executed again.

To determine whether redetermine the measuring range of the pattern to be measured is needed or not, the image processing method 200 of CDSEM may comprise steps S250-S260.

Figure 9:
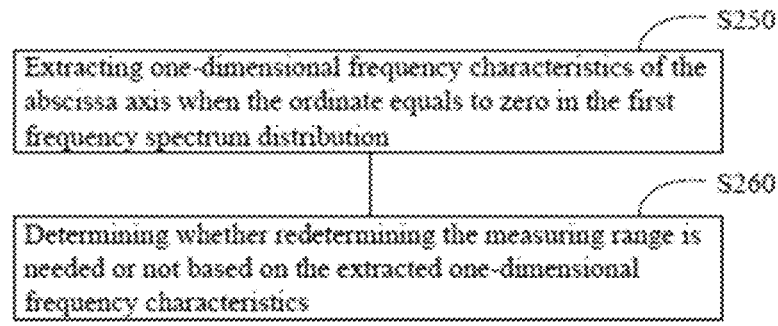
FIG. 9 shows more steps of the flow chart of the CDSEM image processing method according to an embodiment of the present invention.

As shown in FIG. 9, step S250 may comprise: extracting a one-dimensional frequency characteristics of the abscissa axis when the ordinate equals to zero in the first frequency spectrum distribution.

Figure 10:
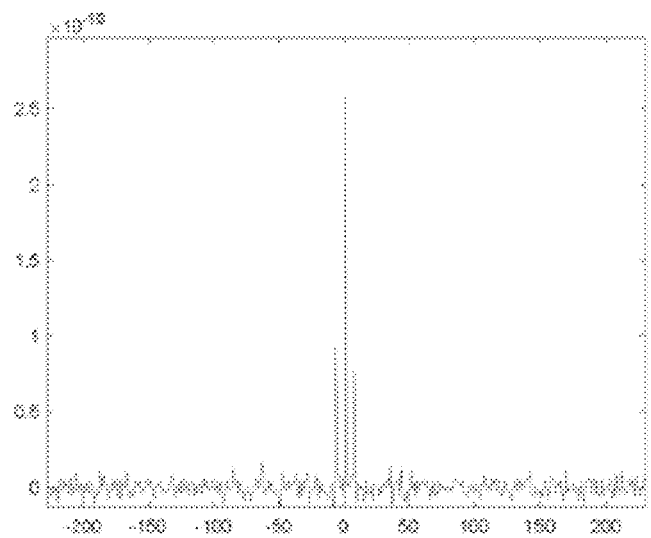
FIG. 10 shows a frequency spectrum of a multi-peak symmetric structure.

The one-dimensional frequency spectrum distribution of many lines/spaces should theoretically show a multi-peak symmetrical structure as shown in FIG. 10, with obvious periodic distribution along the X axis, and its high frequency spectrum components are concentrated near Y=0 and symmetrically distributed along the X axis. Therefore, the one-dimensional frequency spectrum components with Y=0 in the first frequency spectrum distribution can be extracted, and based on the one-dimensional frequency characteristic of the one-dimensional frequency spectrum components with Y=0 to determine whether the background noise is too strong or whether the interference from exposed and developed SRAF is too large.

The background noise and the exposure of SRAF have different directions and irregular frequency spectrum distribution, which makes the extracted one-dimensional frequency spectrum components irregularly distributed, and there are high frequencies in the Y direction. For example, by transforming the pattern to be measured as shown in FIG.

Figure 11:
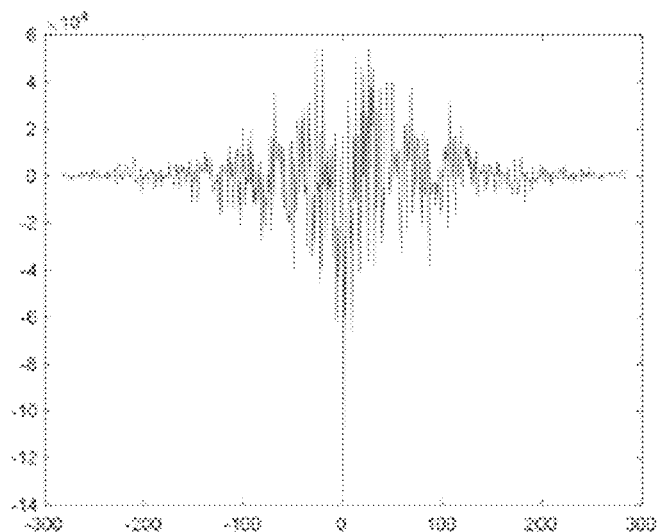
FIG. 11 shows a frequency spectrum with a without-multi-peak symmetric structure.

1 into a gray scale image and applying Fourier transform to it to obtain the first frequency spectrum distribution, extracting the one-dimensional frequency spectrum components with Y=0, the frequency spectrum distribution can be obtained as shown in FIG. 11, which is irregular and messy.

Therefore, furthermore, step S260 may comprise: determining whether redetermine the measuring range is needed or not based on the extracted one-dimensional frequency characteristics.

In response to the one-dimensional frequency characteristics of having a multi-peak symmetric structure, it's determined not to redetermine the measuring range, otherwise, it's determined to redetermine the measuring range.

Although the method is illustrated and described as a series of actions for the purpose of simplifying the explanation, it should be understood and appreciated that these methods are not limited by the order of the actions. Those skilled in the art may understand that some actions may occur in different orders and/or concurrently with other actions that are illustrated and described herein or that are not illustrated and described herein, in accordance with one or more embodiments.

According to another aspect of the present invention, it provides a computer storage medium having computer programs stored therein, wherein the computer programs implement steps of the image processing method of CDSEM in the aforementioned embodiments when the computer programs are executed.

According to another aspect of the present invention, it provides an image processing device of CDSEM which is used to determine the measuring range of the image of the pattern to be measured which is taken by CDSEM machine.

Figure 12:
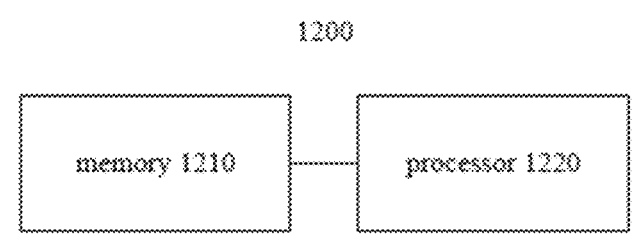
FIG. 12 shows the schematic structure of an image processing device on a CDSEM according to an embodiment of the present invention.

In one embodiment, as shown in FIG. 12, the image processing device 1200 comprises: a memory 1210; and a processor 1220.

The memory 1210 is used to store computer programs.

Processor 1220 is coupled to the memory 1210, and is used to the execute the computer programs stored in the memory 1210. The processor 1210 is configured to: obtain a first gray scale image based on the image of the pattern to be measured; apply the Fourier transform to the first gray scale image to obtain a corresponding first frequency spectrum distribution; filter the frequency spectrum components whose absolute values of ordinate are greater than preset threshold in the first frequency spectrum distribution to obtain a second frequency spectrum distribution; and determine the measuring range based on the second frequency spectrum distribution.

Gray scale image is also called gray level image. Specifically, the relationship between white and black is divided into several levels according to logarithmic relationship, which are called gray scale. Gray scale can be divided into 256 levels. An image represented by of gray scale is a gray scale image.

Using floating-point algorithm, integer method, shift method, average method, green-only method or other existing or future methods may transform the image of the pattern to be measured into the gray scale image.

The frequency of an image is the index characterizing the intensity of gray scale change, and is the gradient of the gray scale in the plane space. For example, a large area of desert is an area with slow gray scale changes in the image, and the corresponding frequency is very low; while for the edge area where the surface attributes change drastically, it is an area with drastic gray scale changes in the image, corresponding to higher frequency.

Fourier transform can transform the function meeting certain conditions into a sine function, a cosine function or a linear combination thereof. Applying the Fourier transform to an image is to transform the gray scale distribution function of the pattern into a frequency distribution function, and applying the inverse Fourier transform to an image is to transform the frequency distribution function of the pattern into a gray scale distribution function.

The Fourier transform is applied to the gray scale image to obtain the frequency spectrum distribution, which is the distribution image of the image gradient. The bright and dark points on the Fourier frequency spectrum distribution, that is, the gradient of the point and the frequency of the point, can be understood in such way that: the low frequency part of the image has a low gradient and the high frequency part has a high gradient. Generally, if the gradient is large, the brightness of the point is strong; otherwise the brightness of the point is weak. Therefore, by analyzing the frequency spectrum distribution which is obtained after the Fourier transform, it is easy to know the energy distribution of the image. If there are more dark points in the frequency spectrum distribution, the actual image is softer, because the points are not much different from their neighbors and the gradient is relatively small. Conversely, if there are many bright points in the frequency spectrum distribution, the actual image must be sharp, with clear boundaries and large differences in pixels on both sides of the boundary.

Generally, the background noise and the exposure and development of SRAF will cause dramatic changes of brightness and darkness in the gray scale image, which corresponds to the increase of gradient in the frequency spectrum distribution. Therefore, analyzing the gradient of the first frequency spectrum distribution image obtained by applying the Fourier transform to the gray scale image of pattern to be measured, the interference from the background noise and the exposure and development of SRAF will be determined.

Generally, the background noise and the exposure and development of SRAF will cause high frequency components in the first frequency spectrum distribution; therefore, filtering the high frequency components in the first frequency spectrum distribution can reduce or eliminate the interference from background noise and the exposure and development of SRAF. The preset threshold is a preset low frequency spectrum threshold, which may be set based on the different requirement of image processing accuracy.

In one preferable embodiment, the processor 1220 may be configured to: filter the frequency spectrum components whose absolute values of ordinate are greater than preset low frequency spectrum threshold in the first frequency spectrum distribution to obtain a second frequency spectrum distribution. Preferably, the preset low frequency spectrum threshold is set to zero.

Preferably, in order to automatically determine the measuring range of the pattern to be measured, it can be determined correspondingly based on the characteristics of frequency spectrum of the central location and the edge position of the measuring range. Furthermore, the processor 1220 may be configured to: determine the central location of measuring range based on the low frequency spectrum components of the second frequency spectrum distribution; determine two edges of the measuring range based on the central location, and high frequency spectrum components of the second frequency spectrum distribution; and determine the measuring range based on the central location and the two edges.

The central location is generally set in the center of the pattern to be measured, which is the position with least changing brightness in gray scale image, and can be determined based on the low frequency spectrum components of the second frequency spectrum distribution.

In one embodiment, to determine the central location of the measuring range, the processor 1220 may be configured to: extract the low frequency spectrum components of the second frequency spectrum distribution to obtain the third frequency spectrum distribution; apply the inverse Fourier transform to the third frequency spectrum distribution to obtain the corresponding third gray scale image; and determine the central location of the measuring range based on the brightness distribution of the third gray scale image.

The low frequency spectrum components can reflect the frequency spectrum components with slow gray scale changes, and gray scales are generally similar at the central location of the measuring range, that is, the gray scale changes slowly. Therefore, the central location of the measuring range can be determined based on the low frequency spectrum components.

Preferably, the high frequency spectrum components in both the X direction and the Y direction may be filtered out. For example, the frequency spectrum components whose sum of absolute value of abscissa and ordinate are less than preset threshold in the second frequency spectrum distribution may be extracted to be the low frequency spectrum components. The preset threshold is a preset low frequency spectrum threshold set based on the requirement of image processing accuracy. The extracted frequency spectrum components constitute the third frequency spectrum distribution. Preferably, the preset low frequency spectrum threshold can be set to 5.

In the third gray scale image, a one-dimensional gray scale image whose ordinates equal to a constant is selected. The abscissas of the positions whose brightness are lowest in the third gray scale image may be determined based on the brightness of the positions where ordinates equal to a constant, and the abscissa of the central location exists among these determined abscissas. Preferably, selecting an abscissa which is the closest to the central location of abscissa of the pattern to be measured from the abscissas with the lowest brightness to be the central location of the measuring range.

Generally, the ordinate at the central location of ordinate of the pattern to be measured can be selected as the constant for obtaining the one-dimensional gray scale image.

The edges are the positions where the gray scale changes sharply, therefore, the edges can be determined by the high frequency spectrum components of the second frequency spectrum distribution. The measuring range should cover the two edges near the central location, and therefore, to determine the two edges, the processor 1220 may be configured to: extract the high frequency spectrum components of the second frequency spectrum distribution to obtain the fourth frequency spectrum distribution; apply the inverse Fourier transform to the fourth frequency spectrum distribution to obtain the corresponding fourth gray scale image; deduct the background noise of the fourth gray scale image; and determine the two edges based on the central location, and the brightness distribution of the fourth gray scale image whose background noises are deducted.

The high frequency spectrum components can reflect the frequency spectrum components with the highest gray scale changes, and the edges of the measuring range are the positions with the highest changes of gray scales. Therefore, the high frequency spectrum components of the second frequency spectrum distribution may be extracted to determine the two edges.

Preferably, the high frequency spectrum components in both the X direction and the Y direction may be extracted. For example, the frequency spectrum components whose sum of absolute value of abscissa and ordinate are higher than preset threshold in the second frequency spectrum distribution may be extracted to be the high frequency spectrum components. The preset threshold is a preset high frequency spectrum threshold set based on the requirement of image processing accuracy. The extracted frequency spectrum components constitute the fourth frequency spectrum distribution. Preferably, the preset high frequency spectrum threshold can be set to 50 or 60.

Specifically, the average brightness of the fourth gray scale image can be determined based on the brightness of all positions in the fourth gray scale image, and then the average brightness is subtracted from the brightness of all the positions in the fourth gray scale image to achieve background noise deduction.

A one-dimensional gray scale image whose ordinate equal to a constant may be selected from the fourth gray scale image whose background noise are deducted. The abscissas of the positions whose brightness are highest may be determined based on the brightness of the positions whose ordinates equal to the constant. The abscissa of the central location exists among these abscissas. Preferably, two abscissas which are closest to the central location of the pattern to be measured may be selected to be the two edges.

The theoretical position of the measuring target is the two edges, but the actual position of the measuring target may deviate from its theoretical position. Therefore, the left measuring range and the right measuring range can be determined respectively based on the two edges, as the searching range of the measuring target.

Furthermore, the left measuring range takes the abscissa which locates on the left of and is the closest to the central location as its center. The right measuring range takes the abscissa which locates on the right of and is the closest to the central location as its center.

The left measuring range is located between the central location and the abscissa with the highest brightness that is the second closest to and on the left of the central location. The right measuring range is located between the central location and the abscissa with highest brightness that is the second closest to and on the right of the central location.

Furthermore, after determining the measuring range, the measurement can be performed at the corresponding position in patterns to be measured taken by the CDSEM machine without any processing.

The determination of the measuring range can be performed when the position of the marker determined in the prior art deviates from the range of the pattern to be measured. In order to determine whether the marker determined by the prior art deviates from the range of the pattern to be measured, that is, to determine whether the image processing method needs to be employed to redetermine the measuring range, the processor 1220 may be configured to: extract a one-dimensional frequency characteristics of the abscissa axis when the ordinate equals to zero in the first frequency spectrum distribution; and determine whether redetermining the measuring range is needed or not based on the extracted one-dimensional frequency characteristics.

The one-dimensional frequency spectrum distribution of many lines/spaces should theoretically show a multi-peak symmetrical structure as shown in FIG. 10, with obvious periodic distribution along the X axis, and its high frequency spectrum components are concentrated near Y=0 and symmetrically distributed along the X axis. Therefore, the one-dimensional frequency spectrum components with Y=0 in the first frequency spectrum distribution can be extracted, and based on the one-dimensional frequency characteristic of the one-dimensional frequency spectrum components with Y=0 to determine whether the background noise is too strong or whether the interference from exposed and developed SRAF is too large. The background noise and pattern of exposed SRAF have different directions and irregular frequency spectrum distribution, and the pattern to be measured is greatly affected by background noise and exposed SRAF, which makes the one-dimensional frequency spectrum components extracted from the pattern to be measured irregularly distributed, and there are high frequencies in the Y direction which are messy.

Therefore, the processor 1220 may be configure to: in response to the one-dimensional frequency characteristics of having a multi-peak symmetric structure, determine not to redetermine the measuring range, otherwise, to redetermine the measuring range.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software as a computer program product, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An image processing method for a CDSEM, comprising:

providing a sample having a pattern to be measured;
acquiring a first gray scale image of the pattern on the CDSEM;

performing Fourier transform to the first gray scale image to obtain a first frequency spectrum distribution comprising first frequency spectrum components;

filtering the first frequency spectrum distribution and excluding those having absolute values of ordinate greater than a preset threshold from the first frequency spectrum components, to obtain a second frequency spectrum distribution comprising second frequency spectrum components; and determining a measuring range of the pattern on the CDSEM based on the second frequency spectrum distribution.

2. The image processing method for the CDSEM of claim 1, wherein the preset threshold is a low frequency threshold, wherein the filtering the first frequency spectrum distribution and excluding those having absolute values of ordinate greater than a preset threshold from the first frequency spectrum components, excluding those having absolute values of ordinate greater than a preset threshold from the first frequency spectrum components to obtain the second frequency spectrum distribution comprises:

filtering the frequency spectrum components whose absolute values of ordinate are greater than the preset low frequency spectrum threshold in the first frequency spectrum distribution to obtain the second frequency spectrum distribution.

3. The image processing method for the CDSEM of claim 1, wherein the second frequency spectrum distribution comprises second frequency spectrum components having low frequency spectrum components and high frequency spectrum components, wherein the determining the measuring range of the pattern on the CDSEM based on the second frequency spectrum distribution comprises:

identifying a central location of the measuring range based on the low frequency spectrum components in the second frequency spectrum distribution;

identifying two edges of the pattern for further locating the measuring range based on the central location and the high frequency spectrum components of the second frequency spectrum distribution; and deciding on the measuring range based on the central location and the two edges of the pattern.

4. The image processing method for the CDSEM of claim 3, wherein the identifying the central location of the measuring range based on the low frequency spectrum components in the second frequency spectrum distribution comprises:

extracting the low frequency spectrum components of the second frequency spectrum distribution to obtain a third frequency spectrum distribution;

performing an inverse Fourier transform to the third frequency spectrum distribution to obtain a third gray scale image; and identifying the central location of the measuring range based on a brightness distribution of the third gray scale image.

5. The image processing method for the CDSEM of claim 4, wherein the extracting the low frequency spectrum components of the second frequency spectrum distribution to obtain the third frequency spectrum distribution comprises:

extracting the second frequency spectrum components each having a sum of an absolute abscissa value and an absolute ordinate value being less than a preset low frequency spectrum threshold in the second frequency spectrum distribution, and wherein the extracted second frequency spectrum components form the third frequency spectrum distribution.

6. The image processing method for the CDSEM of claim 4, wherein the identifying the central location of the measuring range based on the brightness distribution of the third gray scale image comprises:

identifying abscissas (X-axis coordinates) in the third gray scale image where brightness are a lowest; and defining the central location of the measuring range at an abscissa which has a lowest brightness and is closest to a central location of the pattern.

7. The image processing method for the CDSEM of claim 3, wherein the identifying the two edges of the measuring range based on the central location and the high frequency spectrum components of the second frequency spectrum distribution comprises:

extracting the high frequency spectrum components of the second frequency spectrum distribution to obtain a fourth frequency spectrum distribution;

performing the inverse Fourier transform to the fourth frequency spectrum distribution to obtain a fourth gray scale image;

deducting background noises of the fourth gray scale image; and identifying the two edges based on the central location and a brightness distribution of the fourth gray scale image after the background noises are substracted.

8. The image processing method for the CDSEM of claim 7, wherein each of the high frequency spectrum components has a sum of an absolute value of abscissa and an absolute value of ordinate, and wherein the sum is greater than a preset high frequency spectrum threshold in the third frequency spectrum distribution.

9. The image processing method for the CDSEM of claim 7, wherein substracting the background noises of the fourth gray scale image comprises:

calculating an average brightness of the fourth gray scale image; and subtracting the average brightness from a brightness at each location in the fourth gray scale image to deduct the background noises.

10. The image processing method for the CDSEM of claim 7, wherein the identifying the two edges based on the central location and the brightness distribution of the fourth gray scale image whose background noises are deducted comprises:

identifying the abscissas of locations which have a highest brightness in the fourth gray scale image after deducting the background noises;

identifying two locations at two abscissas each having a highest brightness and being closest to the central location in the fourth gray scale image as being a left edge and a right edge of the central location respectively;

identifying a position of the left edge in the fourth gray scale image as being a central location of a left measuring range; and identifying a position of the right edge in the fourth gray scale image as being a central location of a right measuring range.

11. The image processing method for the CDSEM of claim 1, further comprising:

determining if it is necessary to redefine the measuring range of the pattern;

if it is necessary, filtering the first frequency spectrum distribution and excluding those having absolute values of ordinate greater than a preset threshold from the first frequency spectrum components to obtain the second frequency spectrum distribution; and determining the measuring range based on the second frequency spectrum distribution.

12. The image processing method for the CDSEM of claim 11, further comprising:
extracting one-dimensional frequency characteristics of an abscissa axis when an ordinate equals to zero in the first frequency spectrum distribution; and
determining if it is necessary to redefine the measuring range of the pattern based on the extracted one-dimensional frequency characteristics.

13. The image processing method for the CDSEM of claim 12, further comprising:
if the one-dimensional frequency characteristics include a multi-peak symmetric structure, it is not necessary to redetermine the measuring range; or
if the one-dimensional frequency characteristics does not include a multi-peak symmetric structure, it is necessary to redetermine the measuring range.

14. An image processing device for a CDSEM machine, comprising:
a memory cell; and
a processor coupled to the memory cell, wherein the processor is configured to:
obtain a first gray scale image based on an image of a target pattern to be measured;
perform Fourier transform to the first gray scale image to obtain a first frequency spectrum distribution comprising first frequency spectrum components;
filter the first frequency spectrum distribution and exclude those having absolute values of ordinate greater than a preset threshold from the first frequency spectrum components, to obtain a second frequency spectrum distribution comprising second frequency spectrum components; and
determining a measuring range of the pattern on the CDSEM based on the second frequency spectrum distribution.

15. The image processing device for the CDSEM of claim 14, wherein the preset threshold is a low frequency spectrum threshold, wherein the processor is further configured to:
filter the frequency spectrum components whose absolute values of ordinate are greater than the preset low frequency spectrum threshold in the first frequency spectrum distribution to obtain the second frequency spectrum distribution.

16. The image processing device for the CDSEM of claim 14, wherein the processor is further configured to:
identify a central location of the measuring range based on low frequency spectrum components in the second frequency spectrum distribution;
identify two edges of the measuring range based on the central location and high frequency spectrum components of the second frequency spectrum distribution; and
determine the measuring range based on the central location and the two edges.

17. The image processing device for the CDSEM of claim 16, wherein the processor is further configured to:
extract the low frequency spectrum components of the second frequency spectrum distribution to obtain a third frequency spectrum distribution;
perform an inverse Fourier transform to the third frequency spectrum distribution to obtain a third gray scale image; and
determine the central location of the measuring range based on a brightness distribution of the third gray scale image.

18. The image processing device for the CDSEM of claim 17, wherein the processor is further configured to:
extracting frequency spectrum components each having a sum of an absolute abscissa value and an absolute ordinate value being less than a preset low frequency spectrum threshold in the second frequency spectrum distribution, and wherein the extracted second frequency spectrum components form the third frequency spectrum distribution.

19. The image processing device for the CDSEM of claim 17, wherein the processor is further configured to:
determine the abscissas of positions whose brightness are lowest in the third gray scale image; and
determine an abscissa whose brightness is lowest and which is closest to a central location of abscissa of the pattern to be measured as being the central location of the measuring range.

20. The image processing device for the CDSEM of claim 16, wherein the processor is further configured to:
extract the high frequency spectrum components of the second frequency spectrum distribution to obtain a fourth frequency spectrum distribution;
perform an inverse Fourier transform to the fourth frequency spectrum distribution to obtain a fourth gray scale image;
deduct background noises of the fourth gray scale image; and
determine the two edges based on the central location, and a brightness distribution of the fourth gray scale image whose background noises are deducted.

* * * * *